United States Patent [19]

Ryczek

[11] Patent Number: 4,595,848
[45] Date of Patent: Jun. 17, 1986

[54] ADJUSTABLE FREQUENCY ON/OFF DELAY CIRCUIT

[75] Inventor: Lawrence J. Ryczek, Nashotah, Wis.

[73] Assignee: Eaton Corporation, Cleveland, Ohio

[21] Appl. No.: 509,948

[22] Filed: Jun. 30, 1983

[51] Int. Cl.[4] .......................... H03K 5/13; H03K 5/159
[52] U.S. Cl. .................................... 307/597; 307/593; 307/602; 307/247 R
[58] Field of Search .................... 307/590, 605, 247 R

[56] References Cited

U.S. PATENT DOCUMENTS

| 3,755,695 | 8/1973 | Krick et al. | 307/595 |
| 3,794,857 | 2/1974 | Milovancevic | 307/595 |
| 3,950,657 | 4/1976 | Sheng et al. | 307/593 |
| 4,047,058 | 5/1977 | Green | 307/595 |

Primary Examiner—S. D. Miller
Assistant Examiner—B. P. Davis
Attorney, Agent, or Firm—Andrus, Sceales, Starke & Sawall

[57] ABSTRACT

An adjustable frequency ON/OFF delay circuit 2 is provided by ON and OFF delay counters 6 and 14 and respective adjustable frequency oscillators 4 and 20. The ON delay counter 6 is enabled by an input ON signal and clocked by its oscillator 4 to a given count for outputting a delayed output ON signal. This counter 6 is disabled by an input OFF signal and outputs the OFF signal without delay. The second counter 14 responds to the first counter 6 for outputting the delayed output ON signal without further delay, and for delaying the output OFF signal. Circuit 2 is ideal for proximity switch applications, particularly photoelectric type proximity switches, for providing a delayed output signal following a given sensed condition.

12 Claims, 1 Drawing Figure

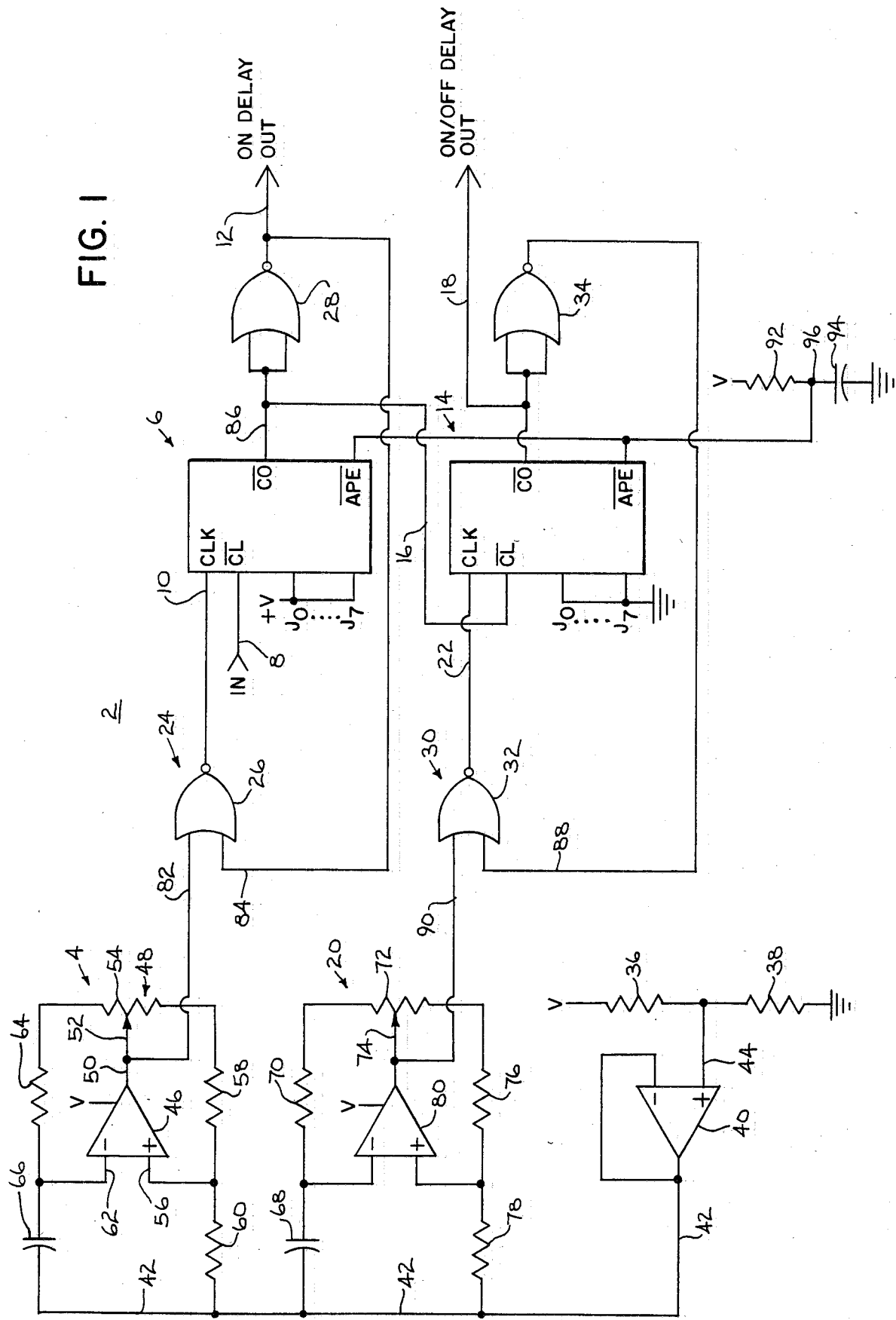

ADJUSTABLE FREQUENCY ON/OFF DELAY CIRCUIT

BACKGROUND AND SUMMARY

The invention provides a timing circuit using a counter which is incremented by an oscillator to yield a delayed output at a given count. The counter is enabled by an input on signal and clocked by the oscillator to the given count, and then outputs an output ON signal delayed from the input ON signal by the given count. The counter is disabled by an input OFF signal and outputs an output OFF signal without delay. A second counter is responsive to the first counter for outputting the delayed output ON signal without further delay, and for delaying the output OFF signal.

A first adjustable frequency oscillator clocks the first counter and controls the ON delay. A second adjustable frequency oscillator clocks the second counter and controls the OFF delay. Both the input ON and input OFF signals are input to the first counter. Each counter includes gate means connected between the output and input of the counter for inhibiting and for allowing clocking therethrough of the respective counter from the respective oscillator.

The circuit is characterized by expanded timing range, reduced power consumption and improved adjustment resolution. Though not limited thereto, the circuit was developed for proximity switches and is particularly useful in photoelectric type proximity switches for providing a delayed output signal following a given sensed condition. The wide range together with the low power consumption makes the circuit ideal for such proximity switch applications.

BRIEF DESCRIPTION OF THE DRAWING

FIG. 1 is a circuit diagram of a timing circuit constructed in accordance with the invention.

DETAILED DESCRIPTION

FIG. 1 shows a timing circuit 2 comprising adjustable frequency oscillator means 4, and counter means 6 enabled by the input signal on line 8 and clocked by the oscillator means on line 10 and outputting an output signal on line 12 delayed by a given count. Counter 6 delays an input ON signal. A second counter 14 responds via line 16 to the first counter for delaying an input OFF signal. The input ON and input OFF signals are each input to the first counter on line 8. The delayed output ON and OFF signals are output on line 18 from the second counter. The delayed output ON signal is also output on line 12 from the first counter. Second adjustable frequency oscillator means 20 is provided for clocking the second counter 14 on line 22 and controlling the OFF delay. The first adjustable frequency oscillator 4 controls the ON delay.

The input ON and OFF signals are carried on input line 8 to a clearing input of the first counter 6, for example the clear not ($\overline{CL}$) input of a CD40102 counter. A carryout output of counter 6, such as the carryout not ($\overline{CO}$) output, is connected by line 16 to a clearing input of second counter 14, such as at the $\overline{CL}$ input of a CD40102 counter. First gate means 24, provided by NOR gates 26 and 28, is connected between the $\overline{CO}$ output of counter 6 and the CLK input of counter 6 for inhibiting or allowing clocking therethrough of first counter 6 by the first adjustable frequency oscillator 4. Second gate means 30, provided by NOR gates 32 and 34, is connected between the $\overline{CO}$ output of second counter 14 and the CLK input of second counter 14 for inhibiting or allowing clocking therethrough of second counter 14 by second adjustable frequency oscillator 20.

Counter 6 is enabled by an input ON signal on line 8 and clocked by oscillator 4 to a given count, and then outputs an output ON signal at its $\overline{CO}$ output delayed from the input ON signal by the given count. Counter 6 is disabled by an input OFF signal on line 8 and outputs an output OFF signal at its $\overline{CO}$ output without further delay. Second counter 14 responds to first counter 6 for outputting the delayed output ON signal on line 18 without further delay, and for delaying the output OFF signal.

Timing circuit 2 and its operation will now be described in greater detail. A voltage divider network formed by resistors 36 and 38 from a voltage source V provides one input to an operational amplifier 40, such as an ICL7631. The other input to op amp 40 is connected in feedback relation from the output such that the voltage on output 42 follows the voltage on input 44. If the voltage at input 44 rises, then the output voltage at 42 rises, which is fed back to the minus input terminal to increase the voltage thereat until the two inputs are in balance. Op amp 40 thus provides a voltage follower affording a reference voltage on line 42.

Oscillator 4 is preferably an adjustable frequency oscillator comprising a comparator 46 and means 48 at the output of the comparator for concurrently changing both charging current and threshold trip voltage for the comparator to change the frequency of oscillation of the comparator output at 50. Means 48 is adjusted in one direction to increase charging current and decrease threshold trip voltage, to increase oscillation frequency. Means 48 is adjusted in another direction to decrease charging current and increase threshold trip voltage, to decrease oscillation frequency.

Means 48 is preferably a potentiometer comprising a wiper 52 connected from the comparator output 50 to a variable point along a pot resistor 54. The lower end of the pot resistor is connected to a reference threshold input terminal 56 of the comparator, such as the plus terminal of an ICL7631 operational amplifier. The lower end of pot resistor 54 is preferably connected to reference input terminal 56 through a voltage divider network formed by resistors 58 and 60 connected to the reference voltage provided on line 42. The upper end of pot resistor 54 is connected in an RC circuit to a comparing input terminal 62 of the comparator, such as the minus terminal of the op amp, for comparison against reference input terminal 56. The RC circuit is provided by resistor 64 and capacitor 66 connected to the reference voltage on line 42.

When wiper 52 is moved downwardly, the threshold trip voltage at reference input terminal 56 is increased, and the charging current to capacitor 66 is decreased, such that it takes longer for the voltage at comparing input terminal 62 to rise in a given polarity direction above the voltage at reference input terminal 56. This decreases the oscillation frequency of the comparator output at 50.

When wiper 52 is moved upwardly, the threshold trip voltage at reference input terminal 56 is decreased, and the charging current to the capacitor 66 is increased, such that it takes less time for the voltage at comparing input terminal 62 to rise in a given polarity direction above the voltage at reference input terminal 56. This increases the oscillation frequency of the comparator output at 50.

The output of comparator 46 switches states when the voltage at comparing input terminal 62 rises in a given polarity direction above the voltage at reference input terminal 56. Capacitor 66 then begins charging in the other polarity direction until the voltage at comparing input terminal 62 drops in the given polarity direction below the voltage at reference input terminal 56, whereupon the comparator output at 50 again switches states to complete an oscillation cycle which is repeated at a frequency controlled by potentiometer 48. The output of comparator 46 alternates between high and low polarity states during alternate half cycles of oscillation. Capacitor 66 charges in alternate polarity directions during alternate half cycles of oscillation. The voltage at reference input terminal 56 alternates between high and low states during alternate half cycles of oscillation.

The operation of second oscillator 20 is comparable, with capacitor 68, resistor 70, pot resistor 72, wiper 74, resistor 76, resistor 78 and op amp 80 corresponding respectively to capacitor 66, resistor 64, pot resistor 54, wiper 52, resistor 58, resistor 60 and op amp 46.

The output frequency from oscillator 4 is provided on line 82 to one of the inputs to NOR gate 26. When the other input on line 84 is low, the output of NOR gate 26 on line 10 will follow the input on line 82 in inverse manner. When line 84 is low, gate 26 thus enables clocking therethrough of counter 6 from oscillator 4.

When the input signal on line 8 transitions high, representing an input ON signal, counter 6 stops clearing and is thus enabled to be incremented by the clock on line 10. Counter 6 is thus clocked by oscillator 4 to a given count, at which time the $\overline{CO}$ output on line 86 goes low, representing a delayed output ON signal. This delayed output ON signal is inverted high by NOR gate 28 to thus provide a positive-going delayed transition on line 12. The positive state on line 12 is fed back on line 84 to NOR gate 26 to disable the latter and force a continuous low state on line 10, thus inhibiting clocking of counter 6.

The delayed low state output ON signal on line 86 is delivered by line 16 to the $\overline{CL}$ input of counter 14. Counter 14 thus continually clears itself and does not count or increment, regardless of whether it is clocked on line 22. The continual clearing of counter 14 thus prevents a given count from being reached, whereby there is no carryout, and hence the $\overline{CO}$ output on line 18 is high. Second counter 14 thus responds to first counter 6 for outputting the delayed output ON signal without further delay. There is a delayed output ON signal on both lines 12 and 18. The high state of the $\overline{CO}$ output of counter 14 is inverted low by NOR gate 34 and fed back on line 88 to the input of NOR gate 32 to enable the latter's output on line 22 to follow in inverse manner the oscillator input on line 90 from oscillator 20, for OFF delay timing, to be described.

When the input signal on line 8 transitions low, representing an input OFF signal, counter 6 continually clears itself and thus does not count or increment, regardless of whether it is clocked by line 0. The $\overline{CO}$ output on line 86 thus goes high, representing an output OFF signal. The high state on line 86 is inverted low by NOR gate 28 such that line 12 transitions low. Counter 6 is thus disabled by an input OFF signal and outputs an output OFF signal without delay.

The nondelayed high state output OFF signal on line 86 is delivered on line 16 to the $\overline{CL}$ input of second counter 14, whereby the latter stops clearing and is enabled to begin counting or incrementing as clocked on line 22. Since input 88 to NOR gate 32 is low, the output of the gate on line 22 follows the input from line 90 in inverse manner. Gate 32 thus allows clocking therethrough of counter 14 from oscillator 20. When counter 14 reaches a given count, the $\overline{CO}$ output on line 18 goes low, representing a delayed output OFF signal. The low state on the $\overline{CO}$ output of counter 14 is inverted high by NOR gate 34 and fed back on line 88 to NOR gate 32 to inhibit the latter and prevent clocking therethrough.

A power-up or initialization circuit is provided by resistor 92 and capacitor 94 to insure proper initial conditions for the timer counters. Point 96 is connected to the $\overline{APE}$ inputs of the CD40102 counters. At turn-on, point 96 is low until capacitor 94 charges, whereafter point 96 is high. All jam inputs are tied high for counter 6 and low for counter 14. Thus at turn-on, the $\overline{CO}$ output of counter 6 is high and the $\overline{CO}$ output of counter 14 is low, for CD40102 counters.

It is recognized that various modifications are possible within the scope of the appended claims.

I claim:

1. A timing circuit comprising:
adjustable frequency oscillator means; and
counter means enabled by an input signal and clocked by said oscillator means and outputting an output signal delayed by a given count;
wherein said counter means delays an input ON signal, and comprising second counter means responsive to the first said counter means for delaying an input OFF signal;
wherein said input ON and said input OFF signals are each input to said first counter means, and wherein delayed output ON and OFF signals are output from said second counter means;
and comprising second adjustable frequency oscillator means for clocking said second counter means and controlling the OFF delay, and wherein the first said adjustable frequency oscillator means controls the ON delay;
wherein said input ON and OFF signals are carried on an input line connected to a clearing input of said first counter means, a carryout output of said first counter means is connected to a clearing input of said second counter means and comprising first gate means connected between said carryout output of said first counter means and a clocking input of said first counter means for inhibiting or allowing clocking therethrough of said first counter means by said first adjustable frequency oscillator means, and comprising second gate means connected between a carryout output of said second counter means and a clocking input of said second counter means for inhibiting or allowing clocking therethrough of said second counter means by said second adjustable frequency oscillation means.

2. A timing circuit comprising:
adjustable frequency oscillator means; and
counter means enabled by an input signal and clocked by said oscillator means and outputting an output signal delayed by a given count;
wherein:
said adjustable frequency oscillator means comprises comparator means, and means for changing charging current and threshold trip voltage for said comparator means to change the frequency of oscillation of the output of said comparator means;

said last mentioned means is at the output of said comparator means and is adjusted in one direction to increase charging current and decrease threshold trip voltage to increase oscillation frequency, and is adjusted in another direction to decrease charging current and increase threshold trip voltage to decrease oscillation frequency;

said last mentioned means comprises potentiometer means comprising a wiper connected from said comparator means output to a variable point along a pot resistor, the lower end of said pot resistor connected to a reference threshold input terminal of said comparator means, the upper end of said pot resistor connected in an RC circuit to a comparing input terminal of said comparator means for comparison against said reference input terminal;

such that when said wiper is moved downwardly, the threshold tip voltage at said reference input terminal is increased, and the charging current to the capacitor of said RC circuit is decreased, such that it takes longer for the voltage at said comparing input terminal to rise in a given polarity direction above the voltage at said reference input terminal, to decrease the oscillation frequency of said comparator means output, such that when said wiper is moved upwardly, the threshold trip voltage at said reference input terminal is decreased, and the charging current to the capacitor of said RC circuit is increased, such that it takes less time for the voltage at said comparing input terminal to rise in a given polarity direction above the voltage at said reference input terminal, to increase the oscillation frequency of said comparator means output;

said comparator means output switches states when the voltage at said comparing input terminal rises in a given polarity direction above the voltage at said reference input terminal, whereupon said capacitor of said RC circuit charges in the other polarity direction until the voltage at said comparing input terminal drops in the given polarity direction below the voltage at said reference input terminal, whereupon said comparator means output again switches states to complete an oscillation cycle which is repeated at a frequency controlled by said potentiometer means.

3. The invention according to claim 2 wherein:
said comparator means output alternates between high and low polarity states during alternating half cycles of said oscillation;
said capacitor of said RC circuit charges in alternate polarity directions during alternate half cycles of said oscillation;
the voltage at said reference input terminal alternates between high and low states during alternate half cycles of said oscillation;
the bottom end of said pot resistor is connected in a voltage divider network to said reference input terminal of said comparator means; and
said comparator means comprises an operational amplifier.

4. The invention according to claim 3 wherein:
said voltage divider network and said RC circuit are connected to a reference voltage; and said reference voltage is provided by voltage follower means comprising an operational amplifier having an output connected to said voltage divider network and said RC circuit, having one input supplied by a given voltage, and having another input connected in feedback relation from the output of said last mentioned operational amplifier such that the voltage on said last mentioned output follows the voltage on said last mentioned one input.

5. A timing circuit comprising:
oscillator means;
counter means enabled by an input ON signal and clocked by said oscillator means to a given count and then outputting an output ON signal delayed from said input ON signal by said given count, said counter means being disabled by an input OFF signal and outputting an output OFF signal without delay;
second counter means responsive to the first said counter means for outputting said delayed output ON signal without further delay, and for delaying said output OFF signal; and
second oscillator means for clocking said second counter means and controlling the OFF delay, and wherein the first said oscillator means controls the ON delay, said input ON and said input OFF signals each being input to said first counter means, the delayed output ON and OFF signals each being output from said second counter means.

6. The invention according to claim 5 wherein said input ON and OFF signals are each carried on an input line connected to a clearing input of said first counter means, a carryout output of said first counter means is connected to a clearing input of said second counter means, and comprising first gate means connected between said carryout output of said first counter means and a clocking input of said first counter means for inhibiting or allowing clocking therethrough of said first counter means by said first oscillator means; and comprising second gate means connected between a carryout output of said second counter means and a clocking input of said second counter means for inhibiting or allowing clocking therethrough of said second counter means by said second oscillator means.

7. The invention according to claim 5 wherein:
said first oscillator means comprises first adjustable frequency oscillator means comprising first comparator means and first means at the output of said first comparator means for concurrently changing both charging current and threshold trip voltage for said first comparator means to change the frequency of oscillation of said first comparator means output; and
said second oscillator means comprises second adjustable frequency oscillator means comprising second comparator means and second means at the output of said second comparator means for concurrently changing both charging current and threshold trip voltage for said second comparator means to change the frequency of oscillation of said second comparator means output.

8. The invention according to claim 7 wherein:
said first means at the output of said first comparator means comprises first potentiometer means comprising a first wiper connected from said first comparator means output to a variable point along a first pot resistor, the lower end of said first pot resistor connected to a reference threshold input terminal of said first comparator means, the upper end of said first pot resistor connected in a first RC circuit to a comparing input terminal of said first comparator means for comparison against said reference input terminal of said first comparator means;

such that when said first wiper is moved downwardly, the threshold trip voltage at said reference input terminal of said first comparator means is increased, and the charging current to the capacitor of said first RC circuit is decreased, such that it takes longer for the voltage at said comparing input terminal of said first comparator means to rise in a given polarity direction above the voltage at said reference input terminal of said first comparator means, to decrease the oscillation frequency of said first comparator means output;

such that when said first wiper is moved upwardly, the threshold trip voltage at said reference input terminal of said first comparator means is decreased, and the charging current to said capacitor said first RC circuit is increased, such that it takes less time for the voltage at said comparing input terminal of said first comparator means to rise in a given polarity direction above the voltage at said reference input terminal of said first comparator means, to increase the oscillation frequency of said first comparator means output;

said first comparator means output switches states when the voltage at said comparing input terminal rises in a given polarity direction above the voltage at said reference input terminal, whereupon said capacitor of said first RC circuit charges in the other polarity direction until the voltage at said comparing input terminal drops in the given polarity direction below the voltage at said reference input terminal, whereupon said first comparator means output again switches states to complete an oscillation cycle which is repeated at a frequency controlled by said first potentiometer means;

said second means at the output of said second comparator means comprises second potentiometer means comprising a second wiper connected from said second comparator means output to a variable output along a second pot resistor, the lower end of said second pot resistor connected to a reference threshold input terminal of said second comparator means, the upper end of said second pot resistor connected in a second RC circuit to a comparing input terminal of said second comparator means for comparison against said reference input terminal of said second comparator means;

such that when said second wiper is moved downwardly, the threshold trip voltage at said reference input terminal of said second comparator means is increased, and the charging current to the capacitor of said second RC circuit is decreased, such that it takes longer for the voltage at said comparing input terminal of said second comparator means to rise in a given polarity direction above the voltage at said reference input terminal of said second comparator means, to decrease the oscillation frequency of said second comparator means output;

such that when said second wiper is moved upwardly, the threshold trip voltage at said reference input terminal of said second comparator means is decreased, and the charging current to said capacitor of said second RC circuit is increased, such that it takes less time for the voltage at said comparing input terminal of said second comparator means to rise in a given polarity direction above the voltage at said reference input terminal of said second comparator means, to increase the oscillation frequency of said second comparator means output;

said second comparator means output switches states when the voltage at said comparing input terminal of said second comparator means rises in a given polarity direction above the voltage at said reference input terminal of said second comparator means, whereupon said capacitor of said second RC circuit charges in the other polarity direction until the voltage at said comparing input terminal of said second comparator means drops in the given polarity direction below the voltage at said reference input terminal of said second comparator means, whereupon said second comparator means output again switches states to complete an oscillation cycle which is repeated at a frequency controlled by said second potentiometer means.

9. A timing circuit comprising:
first adjustable frequency oscillator means;
second adjustable frequency oscillator means;
first counter means;
second counter means;
said first counter means being enabled by an input ON signal and clocked by said first adjustable frequency oscillator means to a given count and then outputting an output ON signal delayed from said input ON signal by said given count;
said first counter means being disabled by an input OFF signal and outputting an output OFF signal without delay;
first gate means connected between the output and input of said first counter means for inhibiting or allowing clocking therethrough of said first counter means from said first adjustable frequency oscillator means;
said second counter means being responsive to said first counter means for delaying said OFF signal;
said input ON and said input OFF signals each being input to said first counter means;
said delayed output ON and OFF signals each being output from said second counter means;
said second adjustable frequency oscillator means clocking said second counter means and controlling the OFF delay;
said first adjustable frequency oscillator means controlling the ON delay;
said second counter means being responsive to said first counter means for outputting said delayed output ON signal without further delay;
said second counter means being enabled by said OFF signal from said first counter means and being clocked by said second adjustable frequency oscillator means to a given count and then outputting an output OFF signal delayed by said last mentioned given count.

10. The invention according to claim 9 wherein said input ON and OFF signals are carried on an input line connected to a clearing input of said first counter means, a carryout output of said first counter means is connected to a clearing input of said second counter means, and where in said first gate means is connected between said carryout output of said first counter means and a clocking input of said first counter means for inhibiting or allowing clocking therethrough of said first counter means by said first adjustable frequency oscillator means, and comprising second gate means connected between a carryout output of said second counter means and a clocking input of said second counter means for inhibiting or allowing clocking therethrough of said second counter means by said second adjustable frequency oscillator means.

11. The invention according to claim 10 wherein each of said first and second gate means comprises OR gate means having one input from its respective said adjustable frequency oscillator means and having the other input from the output of its respective said counter means, and having an output to the clocking input of its respective said counter means.

12. A proximity switch timing circuit comprising:
oscillator means;
counter means enabled by an input ON signal and clocked by said oscillator means to a given count and then outputting an output ON signal delayed from said input ON signal by said given count, said counter means being disabled by an input OFF signal and outputting an output OFF signal without delay;
second counter means responsive to the first said counter means for outputting said delayed output ON signal without further delay, and for delaying said output OFF signal;
second oscillator means for clocking said second counter means and controlling the OFF delay, and wherein the first said oscillator means controls the ON delay, said input ON and said input OFF signals each being input to said first counter means, the delayed output ON and OFF signals each being output from said second counter means;
said first oscillator means comprises first adjustable frequency oscillator means comprising first comparator means and first means at the output of said first comparator means for concurrently changing both charging current and threshold trip voltage for said first comparator means to change the frequency of oscillation of said first comparison means output;
said second oscillator means comprises second adjustable frequency oscillator means comprising second comparator means and second means at the output of said second comparator means for concurrently changing both charging current and threshold trip voltage for said second comparator means to change the frequency of oscillation of said second comparator means output;
said first means at the output of said first comparator means comprises first potentiometer means comprising a first wiper connected from said first comparator means output to a variable point along a first pot resistor, the lower end of said first pot resistor connected to a reference threshold input terminal of said first comparator means, the upper end of said first pot resistor connected in a first RC circuit to a comparing input terminal of said first comparator means for comparison against said reference input terminal of said first comparator means;
such that when said first wiper is moved downwardly, the threshold trip voltage at said reference input terminal of said first comparator means is increased, and the charging current to the capacitor of said first RC circuit is decreased, such that it takes longer for the voltage at said comparing input terminal of said first comparator means to rise in a given polarity direction above the voltage at said reference input terminal of said first comparator means, to decrease the oscillation frequency of said first comparator means output;
such that when said first wiper is moved upwardly, the threshold trip voltage at said reference input terminal of said first comparator means is decreased, and the charging current to said capacitor said first RC circuit is increased, such that it takes less time for the voltage at said comparing input terminal of said first comparator means to rise in a given polarity direction above the voltage at said reference input terminal of said first comparator means, to increase the oscillation frequency of said first comparator means output;
said first comparator means output switches states when the voltage at said comparing input terminal rises in a given polarity direction above the voltage at said reference input terminal, whereupon said capacitor of said first RC circuit charges in the other polarity direction until the voltage at said comparing input terminal drops in the given polarity direction below the voltage at said reference input terminal, whereupon said first comparator means output again switches states to complete an oscillation cycle which is repeated at a frequency controlled by said first potentiometer means;
said second means at the output of said second comparator means comprises second potentiometer means comprising a second wiper connected from said second comparator means output to a variable output along a second pot resistor, the lower end of said second pot resistor connected to a reference threshold input terminal of said second comparator means, the upper end of said second pot resistor connected in a second RC circuit to a comparing input terminal of said second comparator means for comparison against said reference input terminal of said second comparator means;
such that when said second wiper is moved downwardly, the threshold trip voltage at said reference input terminal of said second comparator means is increased, and the charging current to the capacitor of said second RC circuit is decreased, such that it takes longer for the voltage at said comparing input terminal of said second comparator means to rise in a given polarity direction above the voltage at said reference input terminal of said second comparator means, to decrease the oscillation frequency of said second comparator means output;
such that when said second wiper is moved upwardly, the threshold trip voltage at said reference input terminal of said second comparator means is decreased, and the charging current to said capacitor of said second RC circuit is increased, such that it takes less time for the voltage at said comparing input terminal of said second comparator means to rise in a given polarity direction above the voltage at said reference input terminal of said second comparator means, to increase the oscillation frequency of said second comparator means output;
said second comparator means output switches states when the voltage at said comparing input terminal of said second comparator means rises in a given polarity direction above the voltage at said reference input terminal of said second comparator means, whereupon said capacitor of said second RC circuit charges in the other polarity direction until the voltage at said comparing input terminal of said second comparator means drops in the given polarity direction below the voltage at said reference input terminal of said second comparator means, whereupon said second comparator means output again switches states to complete an oscillation cycle which is repeated at a frequency controlled by said second potentiometer means.

* * * * *